United States Patent [19]

Scharr et al.

[11] Patent Number: 4,676,857
[45] Date of Patent: Jun. 30, 1987

[54] METHOD OF MAKING MICROWAVE HEATING MATERIAL

[75] Inventors: Jerome M. Scharr, West Hartford, Conn.; Barry Skolnick, East Windsor, N.J.

[73] Assignee: Scharr Industries Inc., Bloomfield, Conn.

[21] Appl. No.: 820,525

[22] Filed: Jan. 17, 1986

[51] Int. Cl.[4] .................. B44C 1/17; B65D 85/00
[52] U.S. Cl. .................... 156/233; 156/239; 156/240; 426/107
[58] Field of Search ............... 156/230, 233, 241, 540, 156/249, 235, 239, 240, 289; 426/106, 107, 108; 428/344, 209

[56] References Cited

U.S. PATENT DOCUMENTS

| | | | |
|---|---|---|---|
| 3,240,647 | 3/1966 | Morgan | 156/233 |
| 3,480,500 | 11/1969 | Hoffer | 156/233 |
| 4,196,331 | 4/1980 | Leueckis et al. | 426/107 |
| 4,230,924 | 10/1980 | Brastad et al. | 426/107 |
| 4,267,224 | 5/1981 | Kauzelberger | 156/239 |
| 4,584,039 | 4/1986 | Shea | 156/233 |
| 4,586,976 | 5/1986 | Takauo et al. | 156/233 |

FOREIGN PATENT DOCUMENTS 739332 5/1943 Fed. Rep. of Germany ...... 156/233

Primary Examiner—Donald E. Czaja
Assistant Examiner—Louis Falasco
Attorney, Agent, or Firm—Fishman & Dionne

[57] ABSTRACT

A microwave heating material and method of forming thereof is presented. In accordance with the present invention, a pre-selected metallized pattern is disposed on at least a portion of a dielectric material using a transfer process, preferably a hot stamping transfer process in conjunction with very thin metal, preferably aluminum roll leaf. The roll leaf can be easily hot-stamped in any variety of patterns such as dots, spirals, circles or any other desired pattern onto disposable or reuseable trays, flexible wraps, rigid substrates or any other suitable dielectric material. Such a transfer process is relatively inexpensive both in terms of labor and other costs.

23 Claims, 9 Drawing Figures

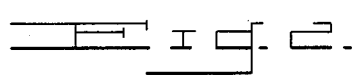
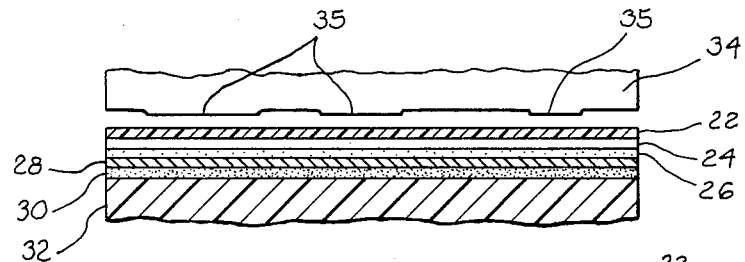
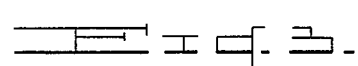
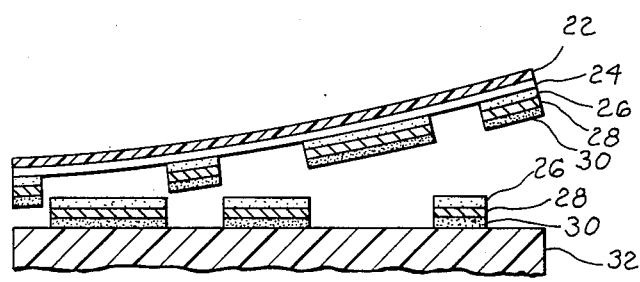
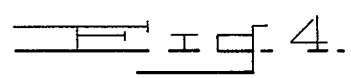
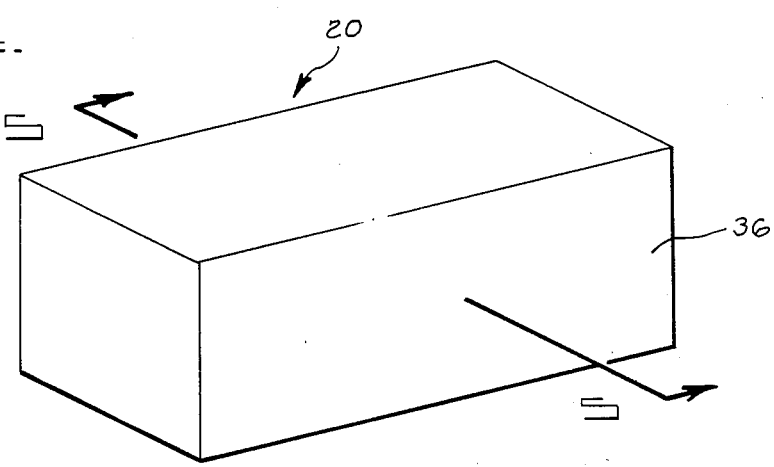
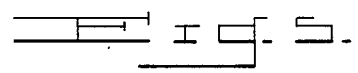
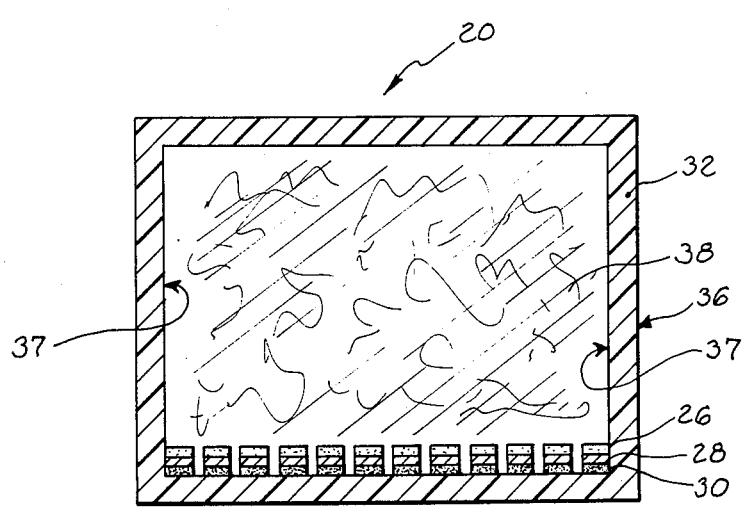

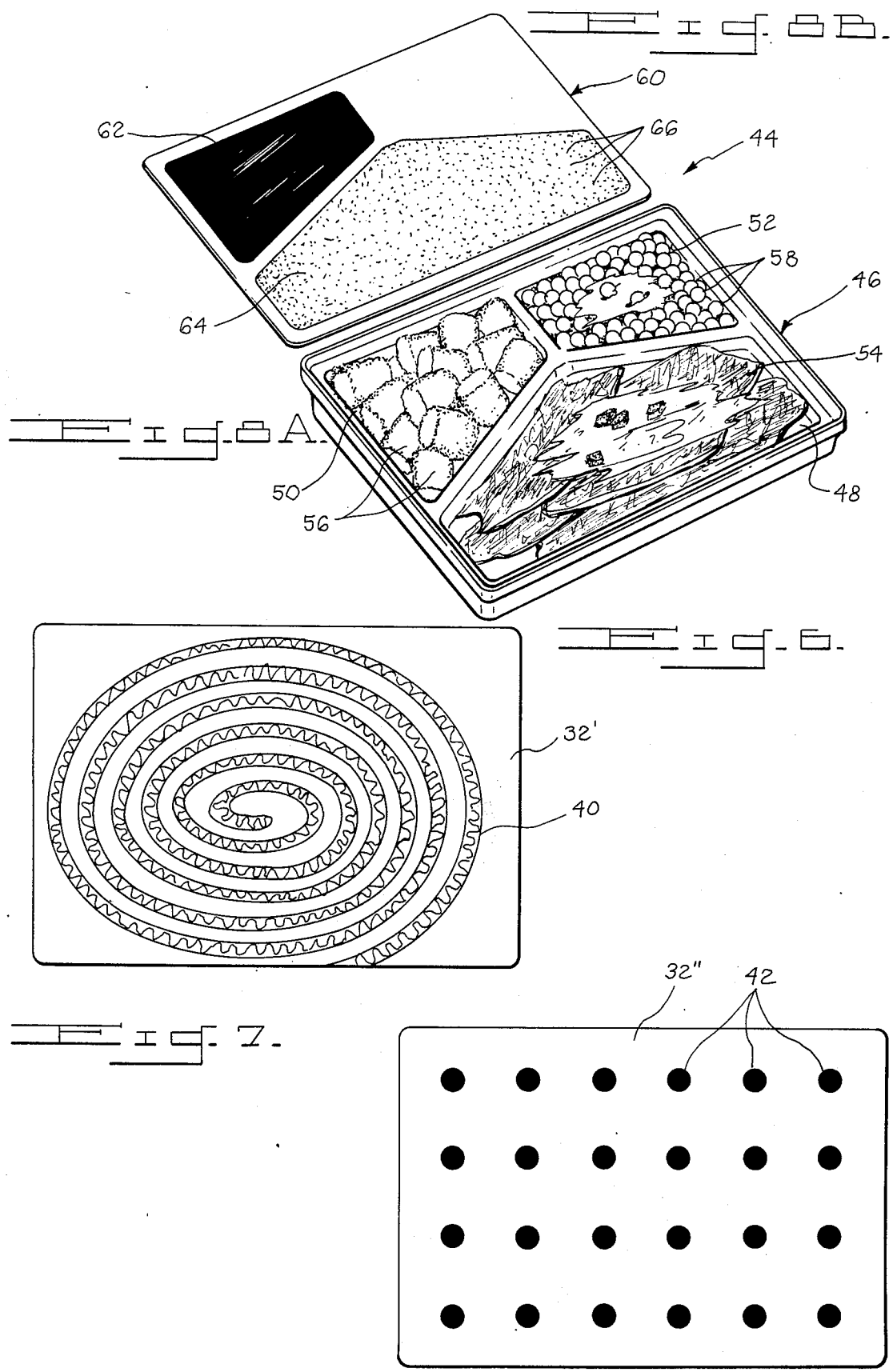

METHOD OF MAKING MICROWAVE HEATING MATERIAL

BACKGROUND OF THE INVENTION

This invention relates to a microwave heating material and a method of making the same. More particularly, this invention relates to a new and novel microwave heating or packaging material comprised of a dielectric substrate having a predetermined metallized pattern selectively disposed thereon for use in permanent and disposable food containers, food wrappers and certain industrial applications involving microwave heating. This invention also relates to a novel method of manufacturing a microwave packaging material utilizing a transfer process and preferably a hot stamping transfer process.

The following discussion of the prior art and the present invention will be in terms of its application in conjunction with containers and packaging for use with microwave ovens. It will be appreciated however, that the microwave packaging material and method of making the same is equally applicable to any other field wherein high intensity microwave heating is utilized.

It will be appreciated that the use of microwave energy (e.g. microwave ovens) in food preparation and cooling is now quite common. One of the primary problems with microwave energy cooking is that it fails to provide the proper so-called browning, searing and/or crisping to the foods which are normally expected to have such a quality. Therefore, foods of this type, after being heated or cooked in the microwave, do not possess the degree of appeal and taste normally expected.

Many attempts have been made to correct this lack of browning when microwave energy is used. One attempt to solve the browning problem is the inclusion of various modifications such as an electrical broiler element in the microwave oven to produce the short-wave energy needed to brown food. Another solution has been to use various types of eatable coatings, which only add the appearance of surface browning (such materials are designed to brown the food for aesthetics only).

Other attempts at solving the browning problem have been directed at modifications of the microwave energy itself by using special utensils, pans and packages to convert the high frequency microwave energy by resistance losses into heat. Heat gives the requisite browning effect and coloration to the food.

Some of these special utensils, pans and packages are illustrated in U.S. Pat. Nos. 3,302,632; 3,701,872; 3,777,099; 4,190,757; 4,230,924, 4,267,420, 4,268,738 and 4,434,197. Of particular interest with respect to the present invention are, the special packages illustrated in U.S. Pat. Nos. 4,230,924 and 4,267,420.

U.S. Pat. No. 4,230,924 to Brastad et al discloses a flexible dielectric substrate in the form of a sheet of plastic or paper having a metallic coating thereon. The metallic coating is sub-divided into a number of metallic islands or pads with non-metallic gaps or strips therebetween. The size of the gaps can be varied and, thus, permit selected amounts of microwave energy to be transmitted through the sheet. In related U.S. Pat. No. 4,267,420 to Brastad, a similar construction is disclosed except that the metallic coating is continuous and uninterrupted rather than being sub-divided into a plurality of islands or pads.

As is clear from a reading of the above discussed patents, particularly patent Nos. 4,230,924 and 4,267,420, the use of metallized (typically aluminized) films for microwave cooking has been well established. These films are usually comprised of laminates which contain one layer of controlled density metallized film. The metallized film consists of polyester, vacuum metallized to a level of 300 OHMS/Sq. (O.D. 0.18-0.21). This laminate is used to either wrap the food material; or is made rigid by a further lamination to boardstock and then cut and placed into a package which contains the food to be microwaved (this laminate can consist of only one film metallized and laminated to board).

Several problems and deficiencies are present in these prior art methods of manufacturing microwaveable metallized film laminates. For example, the inventors herein have found it extremely desirable to form the metallized layer in a preselected pattern disposed on a substrate. However, it is very difficult to create this high intensity metallized heating layer (leading to browning) in a pattern. Moreover, it is very expensive and labor intensive to cut a desired pattern (i.e., spirals, circles, dots, strips, etc.) from a metallic film and then bond and support these cut patterns on a substrate. In the case of board laminates, die cutting would be necessary and expensive board would be needed so that odors, charring and singeing would be avoided.

SUMMARY OF THE INVENTION

The above-discussed and other problems and deficiencies of the prior art are overcome or alleviated by the microwave heating or packaging material and method of forming thereof of the present invention. In accordance with the present invention, a pre-selected metallized pattern is disposed on at least a portion of a dielectric material using a transfer process, preferably a hot stamping transfer process in conjunction with very thin metal, preferably aluminum roll leaf. The roll leaf can be easily hot-stamped in any variety of patterns such as dots, spirals, circles or any other desired pattern. Such a transfer process is relatively inexpensive both in terms of labor and other costs.

The present invention provides many features and advantages heretofore not found in the prior art. For example, preselected areas or portions on a microwave package or container may have the metallized pattern selectively applied thereto which would therefore preclude the need of an expensive add-on card commonly used in conjunction with many microwaveable packaging such as popcorn packaging. Also, patterned cooking could be provided by the use of trays having metallized patterns of dots, circles, squares, etc. which would heat and brown slower cooking foods at the same rate of speed as other faster cooking foods. This application of the present invention would be especially advantageous in all microwaveable multiple food type packaging (i.e., TV dinners). A selectively metallized pattern microwave package will improve overall efficiency during cooking since the package (for example, flexible wrap) could be metallized only where necessary such as, for example, on the bottom of the food to create browning while allowing clear packaging on the top thereof which permits full microwave penetration.

Also, inexpensive cooking trays could be made as disposable heating trays for consumers using the low cost manufacturing process of the present invention. This manufacturing process (with regard to reuseable or disposable heating trays) could be accomplished by hot stamping rigid plastic and then forming the hot stamped plastic into a tray. It will be appreciated that the applications of the present invention in certain industrial areas is also unlimited. The patterned hot stamping technique may be used whenever high efficiency microwave energy is suitable. Products which require fast heating in specific spots may be heated at rapid speeds without damaging other more vulnerable sections.

It should also be pointed out that this method of creating a pattern of metal in a predetermined form can be used to repel microwave energy as well. If this pattern created through roll leaf or hot stamping is located on the top or around the sides of the food package, that is, not necessarily in contact with the food, the microwave energy would be repelled in those areas, absorbed and reradiated, thus allowing differential cooking time without necessarily creating a browning effect.

The above-described and other features and advantages of the present invention will be apparent to and understood by those skilled in the art from the following detailed description and drawings.

BRIEF DESCRIPTION OF THE DRAWINGS

Referring now to the drawings, wherein like elements are numbered alike in the several FIGURES:

FIG. 2 is a cross-sectional elevation view of a plurality of layers of materials and patterning tool prior to a hot stamping operation;

FIG. 3 is a cross-sectional elevation view of the layers of materials in FIG. 2 subsequent to hot stamping;

FIG. 4 is a food item wrapped with the microwave packaging material manufactured in accordance with the present invention;

FIG. 5 is a cross-sectional elevation view along the line 5—5 of FIG. 4;

FIG. 6 is a plan view of the microwave packaging material of the present invention in a spiral configuration;

FIG. 7 is a plan view of the microwave packaging material of the present invention comprising a plurality of circles;

FIG. 8A is a perspective view of a food tray utilizing the patterned microwave packaging material in accordance with the present invention; and FIG. 8B is a perspective view of the bottom inside surface of the food tray of FIG. 8A.

DESCRIPTION OF THE PREFERRED EMBODIMENT

Figure 1:
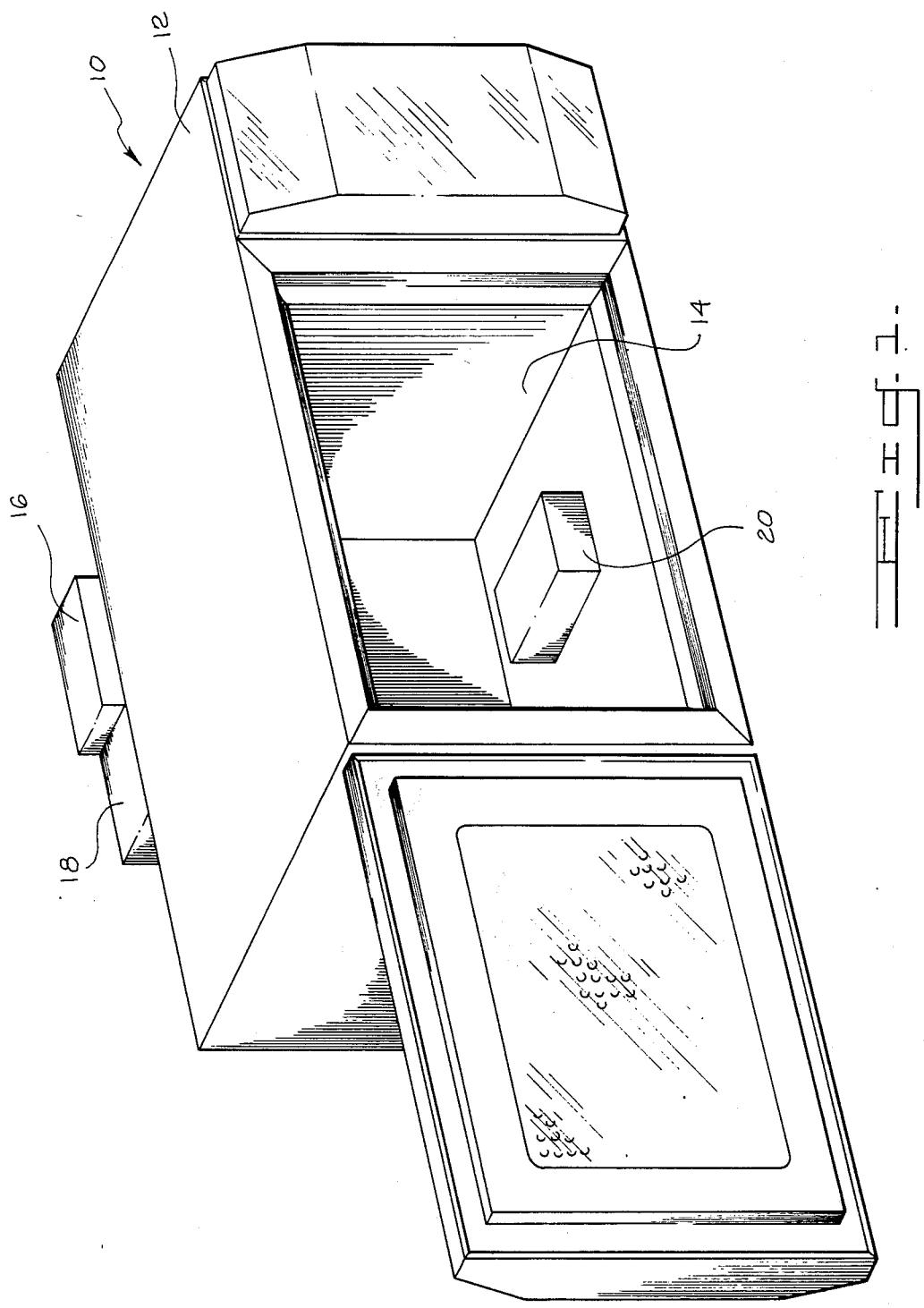
FIG. 1 is a perspective view of a microwave oven used in food preparation.

In accordance with the present invention, a preselected metallized pattern is disposed on at least a portion of a dielectric material using a transfer process and preferably a hot stamping transfer process. The product derived therefrom is well suited for use in conjunction with heating items using microwave energy (for example, heating food in a microwave oven), wherein browning, searing and/or crisping is desired at selected areas on the food.

Referring now to FIG. 1, a conventional microwave oven is shown generally at 10. Microwave oven 10 comprises a cabinet 12 having a cooking cavity 14 therein wherein food is placed to be heated by microwave energy. The microwave energy is introduced into cavity 14 from a high frequency energy source 16 such as a magnatron, through a wave guide 18. The electromagnetic waves are radiated and reflected within cavity 14 and such energy is absorbed by the food to be heated. An example of a food item to be heated is shown generally at 20 in oven cavity 14 of oven 10.

As will be discussed in greater detailed hereinafter, there are numerous features and advantages in conjunction with the present invention, particularly in the manner in which the metallization is selectively disposed in patterns over at least a portion of the dielectric substrate. However, it has been found that it is very difficult to achieve the desired patterns of metallization due to the very thin metal layer needed. Accordingly, an important feature of the present invention is that the selective patterning of metallization is achieved by any well known transfer process such as hot stamping. In particular, it has been found that a hot stamping transfer process provides the most preferred results.

Referring now to FIGS. 2 and 3, an example of a typical hot stamping process used to manufacture the microwave material of the present invention is shown. Initially, a plurality of layers of different materials is constructed as is shown in FIG. 2. Thus, a suitable carrier film 22 comprised of any suitable plastic such as a polyester having gages preferably ranging from ¼ mil to 2 mil is provided with a waxy coating 24 thereon. Waxy coating 24 may be comprised of a wax or silicone type system which is applied to carrier film 22 at levels of about 0.01 lbs./ream to about 2 lbs./ream. It will be appreciated that this waxy coating 24 aids in the release from the carrier film as well as acting as a quick release for the final microwave food product once the present invention has been utilized as will be discussed hereinbelow. A lacquer coating 26 is provided on waxy coating 24. Lacquer coating 26 comprises a heat resistant coating which will provide relatively easy pattern release during hot stamping and will also act as a dielectric for suitable microwave coupling. This hard lacquer coating may be applied at 1/10 of a lb/ream to about 4 lb/ream and may be formulated from any one of the many FDA approved lacquers including, but not limited to acrylic and nitro cellulose and combinations thereof. Next, a metallized layer 28 (preferably in roll leaf form) which has been formed by vacuum deposition of any suitable metal or alloy (preferably aluminum) to a level of about 0.18 to about 0.21 O.D. is provided on lacquer layer 26. It will be appreciated that the metal level is not limited to this range and may also be functional in a range of from about 0.1 O.D. to about 300 O.D. The level or depth of the metal will be determined by the desired heating requirements. Finally, a heat actuated adhesive layer 30 is disposed between metal layer 28 and a dielectric substrate material 32. It will be appreciated that dielectric substrate material 32 may comprise a flexible microwave packaging material, rigid film used in making permanent or disposable food trays or the like, a board product or any other substrate wherein the microwave material of the present invention may be used. The adhesive is comprised of any suitable heat seal adhesive such as but not limited to acrylic, vinyl and polyester and will vary in thickness preferably from about 1/10 of a lb/ream to about 10 lbs/ream.

After the layers have been constructed in the manner shown in FIG. 2, a hot patterning tool 34 is applied to carrier film 22. Hot patterning tool will be heated in a pre-selected pattern which conforms to the desired pattern of metallization necessary for the end product (and which is indicated by the raised areas identified at 35). For example, as will be discussed hereinbelow, hot patterning tool 34 may have a pattern such as the spiral shown in FIG. 6 or the plurality of circles or dots shown in FIG. 7. Raised areas 35 will contact carrier sheet 22 and thereby apply heat and pressure to the layered construction. The heat and pressure from tool 34 will then actuate the adhesive 30 thereby causing adhesive 30 to cure in accordance with the pre-selected raised pattern 35 on tool 34.

Subsequent to heating and the curing of adhesive 30 in conformance with the desired pattern 35, carrier film 22 is removed as shown in FIG. 3. It will be appreciated that in those areas where no heat was applied by tool 34, the unactivated adhesive 30 will not be cured and so will be pulled up along with the other layers by carrier film 22. However, in those areas wherein heat and pressure were applied, and adhesive layer 30 cured, metallized layer 28 and lacquer layer 26 will remain on adhesive 30 with the carrier film 22 removing wax layer 24 in those heated areas. It will be appreciated that the bonding forces between metallized layer 28, lacquer 26 and adhesive 30 are stronger than the bonding forces between lacquer layer 26 and wax layer 24 thereby leading to the patterned result shown in FIG. 3. Thus, as shown in FIG. 3, after carrier film 22 has been removed from the stackup of layers, a pattern is formed which conforms to the heating pattern 35 on tool 34. Thus, the final product comprises the dielectric substrate 32 having selective areas thereon wherein a three layer laminate of adhesive 30, metallization 28 and lacquer 26 remain.

It will be appreciated that all other transfer methods may be utilized in accordance with the present invention. For example, heat seal adhesive layer (layer 30) may be comprised of a pressure sensitive adhesive, the transfer then being accomplished by patterned pressure alone. In addition to this, carrier film 22 may be comprised of a release film such as an Olefin transfer thereby precluding the need for a waxy release coat, and/or a lacquer coat. The transfer process can also be accomplished in a continuous on line laminating technique using patternized rolls and the transfer material described. In this situation, a standard adhesive may be used in place of the heat activated or pressure activated component.

By selectively disposing a pattern of metallization on substrate 32, the degree of browning or crisping of a particular food item may be varied along selected areas of the food item or items. Referring now to FIGS. 4 and 5, a food item which is enclosed by a rigid, semi-rigid or flexible package or wrap is shown generally at 20. Package 36 surrounding food 38 is analogous to the final product shown in FIG. 3. Accordingly, package 36 comprises a dielectric substrate 32 having selectively patterned metallization thereon preferably in the form of a laminate comprising adhesive 30, metallization 28 and outer lacquer layer 26. As is clearly shown in FIG. 5, the top portion of food item 38, and the two opposing lateral sides 37 of package 36 have no metallization thereon while the bottom of package 36 has a selective pattern comprising a plurality of circles, dots, strips or the like thereon. Thus, for example, if package 20 contained hamburg patties, the patternized metallization, i.e., squares, would provide a "grilling" effect and thereby make the food more pleasing to the eye. Of course, it will be appreciated that no browning will occur along the top and lateral sides of food item 38 as no metallization is present therealong. In this way, the microwave energy will more easily penetrate the food items on the top and lateral sides.

In accordance with the present invention, any desired pattern of metallization may be applied to a substrate depending upon the desire end use. These desired patterns may be easily manufactured using a transfer process and particularly a hot stamp transfer process as has been described hereinabove. Thus, in FIG. 6, a plan view of a substrate 32' is shown having a pattern 40 which has a spiral configuration. Such a spiral configuration is analogous to the burner configuration on an electrical range top. Similarly, in FIG. 7, a substrate 32" has a pattern comprising a plurality of circles or dots of metallization 42.

The present invention will be particularly advantageous in constructing disposable or reuseable multicompartmented food trays such as is shown at 44 in FIG. 8A and 8B. Such trays are commonly used in conjunction with frozen prepared meals purchased in supermarkets which are usually disposable; or may consist of reuseable trays for heating and reheating food in the home. Thus, tray 44 will consist of a dielectric material (analogous to substrate 32 in FIGS. 3 and 4). The lower portion of tray 44 identified at 46 comprises three compartments 48, 50 and 52. It will be appreciated that tray portion 60 (FIG. 8B) is representative of the inside bottom surface of lower tray portion 46. By way of example only, larger compartment 48 contains a main entree such as chicken or turkey 54 while smaller compartment 50 contains a side dish such as french fried potatoes 56 with remaining compartment 52 containing a vegetable such as peas 58. It will be appreciated that such food items necessitate a varying degree of browning or crisping to make them appetizing and palatable. Thus, peas 58 necessitate no browning at all while turkey 54 requires a limited amount of browning and potatoes 56 require a must larger degree of browning or crisping. The present invention easily satisfies the varying degree of browning needed in such a meal by providing a selected pattern of metallization along the bottom portion 60 of tray 44 (FIG. 8B). Thus, a continuous or solid pattern of metallization is selectively disposed at 62 on tray bottom 60 which will correspond and be disposed under compartment 50 of bottom portion 46. This continuous layer of metallization will provide a large amount of crisping or browning to french fried potatoes 56. A lesser degree of metallization is disposed along portion 64 of bottom 60 in the form of small circles or dots 66. This lesser degree of metallization will provide a lesser degree of browning or crisping to the main entree 54 in large compartment 48 on bottom portion 41. Finally, no metallization is provided to the remaining portions of bottom 60 and therefore no browning or crisping will be provided to the vegetable 58 in side dish compartment 52. In this way, vegetables 58 will be heated in a conventional microwave fashion with no browning occurring thereto. It will be appreciated then, that the microwave container or tray 44 of FIG. 8 may be tailored to provide a varying degree of browning or crisping depending upon the particular food items provided therein. As discussed hereinabove, the desired patterning of metallization shown on bottom 60 in FIG. 8 may be quickly and relatively inexpensively achieved by use of a transfer method, preferably a hot stamp transfer method as was discussed above.

Conversely, a desired pattern of metallization may be located on the underside of a top cover for the tray (with the metallized pattern on the inner surface of the cover). The metallized cover will then act as a reflector to control microwave heating (as opposed to browning or searing) by reflecting more energy in the areas of greater metallization.

The microwave heating material and method of manufacture thereof in accordance with the present invention provides many features and advantages in the microwave heating art. For example, by using a transfer manufacturing process and preferably a hot stamping transfer manufacturing process, precise patterning can be achieved in an inexpensive manner. Thus, expensive add-on cards now common with, for example, popcorn packaging, would be eliminated by incorporating the metallized patterning of the present invention directly into the popcorn packaging.

Another important feature of the present invention useful in microwave cooking is that disposable or reuseable trays or other packaging may be provided with a varying degree of metallization and selected patterns i.e., dots, circles, squares, spirals, etc. which would heat and brown slower cooking foods at the same rate of speed as other faster cooking foods. As mentioned with regard to FIGS. 8A and 8B above, this packaging concept would be especially useful in all microwaveable multiple food type packaging. This tray such as shown in FIGS. 8A and 8B, may be manufactured in an inexpensive manner and as mentioned, may be either reuseable or disposable. It will be appreciated that decorative and functional characteristics may be added to the trays by utilizing colors in the hot stamping transfer films. The present invention will also provide improved microwave efficiency since the present invention will be metallized only where necessary, for example, on the bottom of the food item (see FIG. 5) so as to create browning while allowing clear packaging on the top to allow for microwave penetration.

The overall efficiency of the present invention will be greater than any film metallized product such as is disclosed in U.S. Pat. Nos. 4,230,924 and 4,267,420 since only a very thin coating of metallization is provided on the film and only in selected areas. Moreover, the use of a lacquer or cover layer will provide faster and more even heat distribution. Another advantage of the present invention is that it will develop a substantially better appearance after use since there is no self-sustaining film utilized directly on the surface of the substrate to delaminate in-tunnel or shrink during the high heat microwaving.

As mentioned, the application of the present invention in industrial areas is unlimited. The patterned hot stamping technique as desired hereinabove may be used where high efficiency microwaving energy is suitable. Thus, products which require fast heating in specific spots or areas may be heated at rapid speeds without damaging other more vulnerable sections. Such industrial applications range from baking goods to printed circuitry.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of making microwave heating material for heating an object comprising the steps of:
   obtaining a dielectric substrate material which permits microwave energy to pass thrrerethrough and into an object to be heated;
   forming a pre-selected metallized pattern on at least a portion of said dielectric substrate material by a transfer process whereby said metallized pattern converts microwave energy to short wave heat energy during microwave heating of said dielectric substrate material and whereby said short wave heat energy is transferred to the object to be heated;
   providing a non-metallic protective layer on said metallized pattern whereby direct contact between said metallized pattern and the object to be heated is precluded.

2. The method of claim 1 wherein said transfer process is a hot stamping process.

3. The method of claim 2 wherein said hot stamping process comprises the steps of:
   providing a layer of heat actuated adhesive on said dielectric substrate material;
   providing a thin layer of metal on said adhesive;
   providing said protective layer on said metal layer;
   providing a release coating on said protective layer;
   providing a carrier film on said release coating, with said adhesive, metal, protective coating, release coating and carrier film defining a stackup; and
   applying heat and pressure selectively to said stack-up in accordance with said pre-selected pattern whereby said adhesive is actuated in those areas which correspond to said pre-selected pattern.

4. The method of claim 3 including the step of:
   removing said stack-up from those areas of said adhesive which were not actuated whereby said actuated adhesive layer, metal layer, and protective coating corresponding to said pre-selected pattern remain on said substrate.

5. The method of claim 1 wherein said protective coating is a lacquer.

6. The method of claim 3 wherein said release coating is a waxy material.

7. The method of claim 3 wherein said metal is aluminum.

8. The method of claim 3 wherein said metal has on OD of about 0.1. to about 300.

9. The method of claim 2 wherein said hot stamping process comprises the steps:
   providing a layer of heat actuated adhesive on said dielectric substrate material;
   providing a thin layer of metal on said adhesive;
   providing said protective layer on said metal layer;
   providing a release film on said protective layer, with said adhesive, metal, protective layer and release film defining a stack-up; and
   applying heat and pressure selectively to said stack-up in accordance with said pre-selected pattern whereby said adhesive is actuated in those areas which correspond to said pre-selected pattern.

10. The method of claim 9 including the step of:
    removing said stack-up from those areas of said adhesive which were not actuated whereby said heat actuated adhesive layer, metal layer and protective layer corresponding to said pre-selected pattern remain on said substrate.

11. The method of claim 9 wherein said metal is aluminum.

12. The method of claim 9 wherein said metal has an OD of about 0.1 to about 300.

13. The method of claim 1 wherein said transfer process comprises the steps of:
   providing a layer of pressure actuated adhesive on said dielectric substrate material;
   providing a thin layer of metal on said adhesive;
   providing said protective coating on said metal layer;
   providing a release coating on said protective layer;
   providing a carrier film on said release coating, with said adhesive, metal, protective layer, release coating and carrier film defining a stack-up; and
   applying pressure selectively to said stack-up in accordance with said pre-selected pattern whereby said adhesive is actuated in those areas which correspond to said pre-selected pattern.

14. The method of claim 13 including the step of:
   removing said stack-up from those areas of said adhesive which were not actuated whereby said actuated adhesive layer, metal layer and said protective layer corresponding to said pre-selected pattern remain on said substrate.

15. The method of claim 13 wherein said protective coating is a lacquer.

16. The method of claim 13 wherein said release coating is a waxy material.

17. The method of claim 13 wherein said material is aluminum.

18. The method of claim 13 wherein said metal has an OD of about 0.1 to about 300.

19. The method of claim 1 wherein said transfer process comprises the steps of:
   providing a layer of pressure actuated adhesive on said dielectric substrate material;
   providing a thin layer of metal on said adhesive;
   providing said protective layer on said metal layer;
   providing a release film on said protective layer, with said adhesive, metal, protective layer and release film defining a stack-up; and
   applying heat and pressure selectively to said stack-up in accordance with said pre-selected pattern whereby said adhesive is actuated in those areas which correspond to said pre-selected pattern.

20. The method of claim 19 including the step of:
   removing said stack-up from those areas of said adhesive which were not actuated whereby said actuated adhesive layer, metal layer and protective layer corresponding to said pre-selected pattern remain on said substrate.

21. The method of claim 19 wherein said metal is aluminum.

22. The method of claim 19 wherein said metal has an OD of about 0.1 to about 300.

23. The method of claim 1 wherein said transfer process comprises the steps of:
   continuously providing a layer of adhesive on said dielectric substrate material;
   continuously providing a thin layer of metal on said adhesive;
   continuously providing said protective layer on said layer of metal;
   selectively laminating said dielectric material, adhesive, metal and protective layer in accordance with patternized rolls having said pre-selected pattern thereon whereby said adhesive is actuated in those areas which correspond to said pre-selected pattern on said patternized rolls.

* * * * *